United States Patent [19]

Sharpe-Geisler et al.

[11] Patent Number: 5,646,901
[45] Date of Patent: Jul. 8, 1997

[54] CMOS MEMORY CELL WITH TUNNELING DURING PROGRAM AND ERASE THROUGH THE NMOS AND PMOS TRANSISTORS AND A PASS GATE SEPARATING THE NMOS AND PMOS TRANSISTORS

[75] Inventors: Bradley A. Sharpe-Geisler, San Jose; Jonathan Lin, Milpitas; Radu Barsan, Cupertino, all of Calif.

[73] Assignee: Advanced Micro Devices, Inc., Sunnyvale, Calif.

[21] Appl. No.: 625,403

[22] Filed: Mar. 26, 1996

[51] Int. Cl.⁶ .................................................. G11C 7/00
[52] U.S. Cl. ............................ 365/218; 365/185; 365/184
[58] Field of Search ............................. 365/185, 149, 365/189, 230.01, 184, 218

[56] References Cited

U.S. PATENT DOCUMENTS

| | | | |
|---|---|---|---|
| 4,829,203 | 5/1989 | Ashmore, Jr. | 307/469 |
| 4,858,185 | 8/1989 | Kowshik et al. | 365/181 |
| 4,862,019 | 8/1989 | Ashmore, Jr. | 307/469 |
| 4,866,307 | 9/1989 | Ashmore, Jr. | 307/469 |
| 4,885,719 | 12/1989 | Brahmbhatt | 365/182 |
| 5,148,391 | 9/1992 | Zagar | 365/96 |
| 5,170,373 | 12/1992 | Doyle et al. | 356/185 |
| 5,270,587 | 12/1993 | Zagar | 307/469 |
| 5,272,368 | 12/1993 | Turner et al. | 257/315 |
| 5,404,328 | 4/1995 | Takemae | 365/185.1 |
| 5,440,509 | 8/1995 | Momodomi et al. | 365/218 |
| 5,555,204 | 9/1996 | Endoh et al. | 365/184 |

*Primary Examiner*—Terrell W. Fears
*Attorney, Agent, or Firm*—Fliesler, Dubb, Meyer & Lovejoy

[57] ABSTRACT

An apparatus and method, the apparatus including an NMOS pass gate separating NMOS and PMOS transistors of a CMOS memory cell configured for tunneling during program and erase through the NMOS and PMOS transistors. The additional NMOS pass gate enables the CMOS memory cell to be utilized as a memory cell in a programmable logic device (PLD). The method includes steps for programming and erasing CMOS memory cells to prevent current leakage. The steps include applying specific voltages to the sources of the NMOS and PMOS transistors during program and erase, rather than leaving either source floating. Such voltages can be applied during program or erase without additional pass gates being connected to the sources of the PMOS or NMOS transistors of individual CMOS cells, or the additional pass gate provided between the drains of the PMOS and NMOS as in the described apparatus.

13 Claims, 7 Drawing Sheets

CMOS MEMORY CELL WITH TUNNELING DURING PROGRAM AND ERASE THROUGH THE NMOS AND PMOS TRANSISTORS AND A PASS GATE SEPARATING THE NMOS AND PMOS TRANSISTORS

BACKGROUND OF THE INVENTION

1. Field of the Invention

The present invention relates to CMOS memory cells having PMOS and NMOS transistors with a common floating gate configured so that program and erase occurs through the gate oxide of the NMOS and PMOS transistors. More particularly, the present invention relates to circuitry, and a method for utilizing the circuitry, to enable such a CMOS memory cell to be used in a programmable logic device (PLD) and to prevent current flow in unselected cells during erase which may disturb programming conditions in the unselected cells.

2. Description of the Related Art

Figure 1:
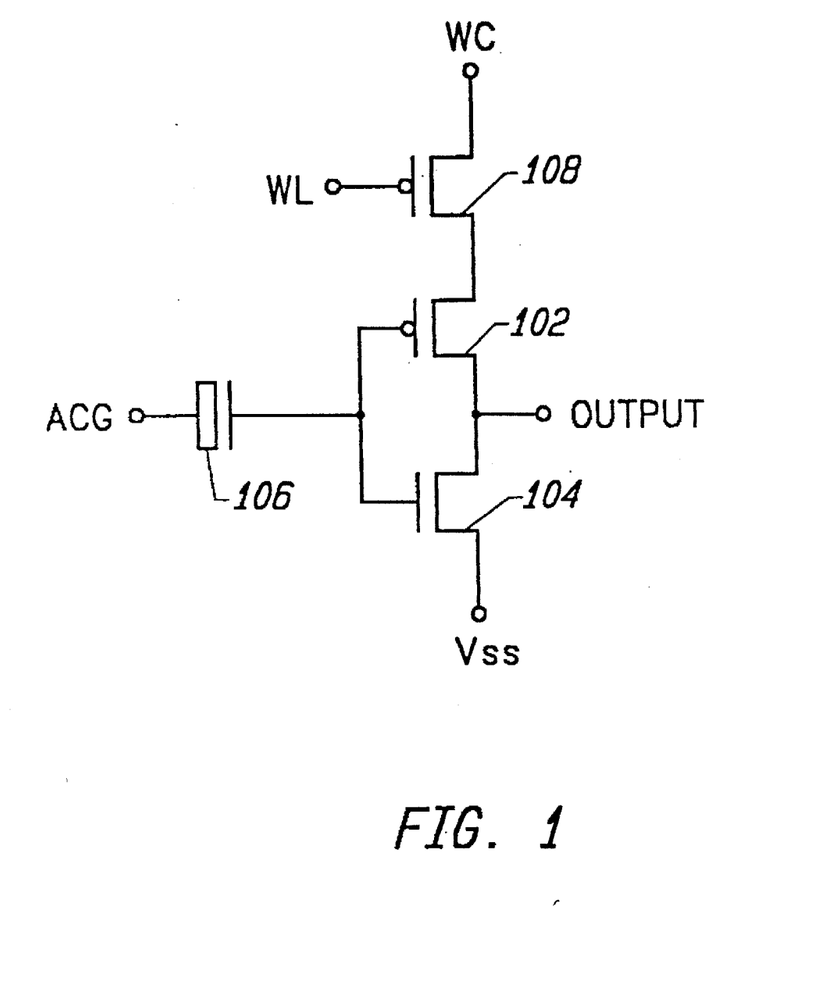
FIG. 1 shows a circuit configuration of a conventional CMOS memory cell.

FIG. 1 shows a circuit configuration of a CMOS memory cell having a PMOS transistor 102 and an NMOS transistor 104 enabling utilization of tunneling through the NMOS and PMOS transistors during program and erase. The PMOS transistor 102 and NMOS transistor 104 have a common floating gate. The drains of transistors 102 and 104 connect together to form an output of the CMOS cell. A capacitor 106 is connected to couple bias voltage from an array control gate (ACG) node to the common floating gate. Bias voltage is provided to the source of the NMOS transistor 104 through a chip ground or Vss pin. A PMOS pass gate transistor 108 supplies a word control (WC) voltage to the source of PMOS transistor 102 as controlled by a word line (WL) voltage supplied to its gate. Transistor 108 is a PMOS device to avoid having to increase the WC voltage above the threshold of an NMOS device during programming. The CMOS memory cell of FIG. 1 is described in detail, along with methods for its program and erase, in U.S. patent application Ser. No. 08/427,117 entitled "A CMOS Memory Cell With Gate Oxide Of Both NMOS and PMOS Transistors As Tunneling Window For Program and Erase," by Lin, et al., filed Apr. 21, 1986, and incorporated herein by reference (hereinafter, the Lin reference).

Figure 2:
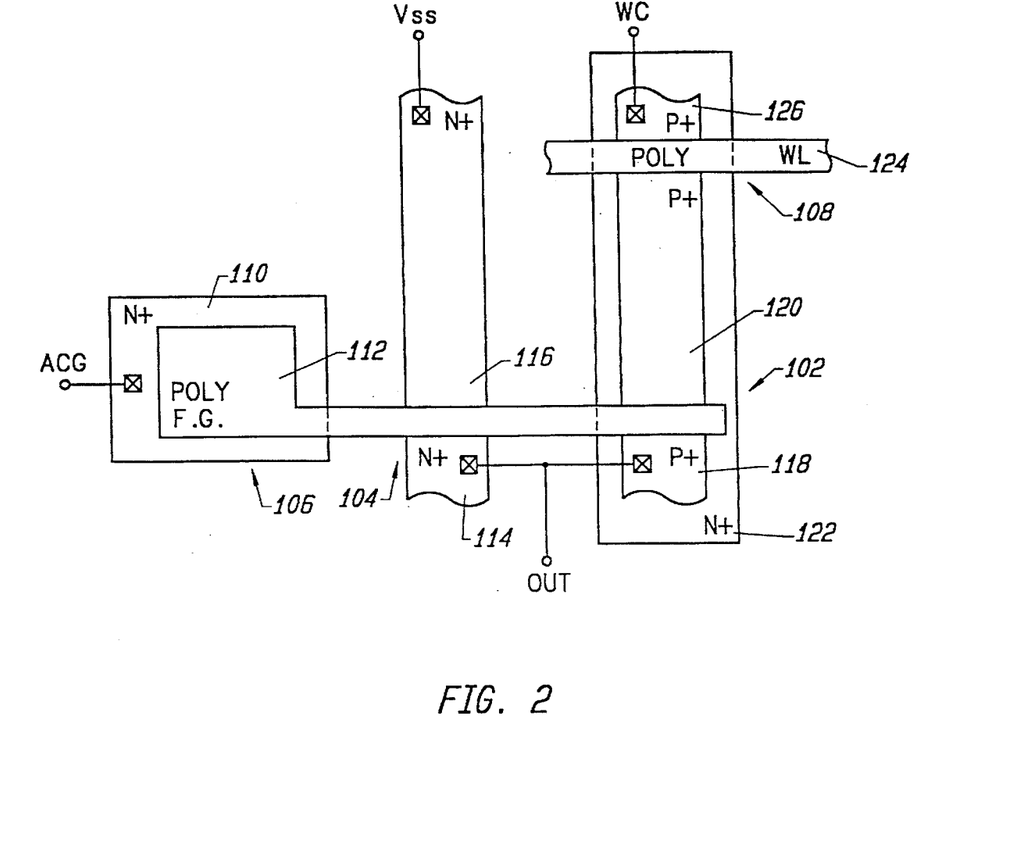
FIG. 2 shows a layout for the CMOS cell of FIG. 1.

FIG. 2 shows a layout for the cell of FIG. 1. The layout for the CMOS cell is formed in a p type substrate. Capacitor 106 is formed using an n+ type implant region 110, including a programming junction region, formed in the p type substrate. Capacitor 106 also includes a gate oxide layer and a common floating gate (F.G.) 112 overlying the n+ implant region 110. Transistor 104 is formed using n+ implant regions 114 and 116 in the p type substrate with the gate oxide region and common floating gate 112 bridging the n+ implant regions 114 and 116. Transistor 102 is formed using p type regions 118 and 120 included in an n+ type well 122, which is included in the p type substrate. Transistor 102 also includes the gate oxide region and common floating gate 112 bridging the two p type regions 118 and 120. Transistor 108 is formed using a polysilicon (POLY) word line (WL) region 124 on the substrate bridging the p type implant region 120 of transistor 102 with an additional p type implant region 126.

To program the CMOS memory cell of FIG. 1, a voltage is applied between the array control gate (ACG) node of capacitor 106 and the source of the PMOS transistor 102 so that electrons transfer from the common floating gate to the source of the PMOS transistor 102. A high impedance is applied to the source of the NMOS transistor 104 during programming to prevent depletion of its channel which would occur if an NMOS transistor 104 were biased to remove electrons from the common floating gate.

To prevent programming of unselected cells in an array of cells similar to FIG. 1 connected to receive the same WC program voltage, a voltage higher than the program voltage applied to the WC line is applied to WL lines of the unselected cells. By applying such a voltage in unselected cells, transistor 108 in those cells will be off to disconnect the WC voltage.

To erase the CMOS memory cell of FIG. 1, a voltage is applied between the array control gate (ACG) node of capacitor 106 and the source of the NMOS transistor 104 so that electrons transfer from the source of the NMOS transistor 104 to the common floating gate. A high impedance is further applied to the source of the PMOS transistor 102 during erase to prevent depletion of its channel, which would occur if a PMOS transistor 102 were biased to add electrons to the floating gate.

Because in an array of CMOS cells, configured as shown in FIG. 1, erase is done in bulk, different voltages are not required for unselected cells as in programming.

Voltages applied to the CMOS memory cell of FIG. 1 during program, erase, read, and not program are indicated in Table I below.

TABLE I

|  | WC | WL | ACG | Vss |
| --- | --- | --- | --- | --- |
| Program | Vpp | Vcc | 0 | Floating |
| Erase | Floating | 0 | Vpp | 0 |
| Read | Vcc | 0 | Vcc/2 | 0 |
| Not Program | Vpp | Vpp | 0 | Floating |

The typical programming voltage Vpp is 12 V. The Vcc voltage indicates the chip power supply input pin voltage which is typically 5 V, or 3 V for low power devices.

Figure 3:
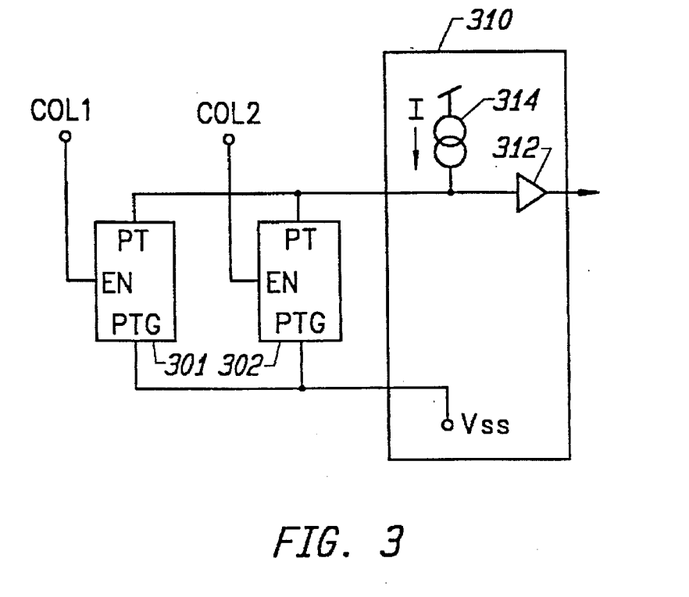
FIG. 3 shows connections of array cells in a PLD.

Because the CMOS cell of FIG. 1 does not include a means to enable or disable a path through the NMOS transistor 104, apart from programming its floating gate, the circuitry of FIG. 1 is not practical for use as an array cell for a PLD. To illustrate, FIG. 3 shows the connections of two array cells 301 and 302 in a PLD. As shown, each array cell 301 and 302 receives an input signal COL1 and COL2 as an enable signal EN. Each of cells 301 and 302 further has one connection to a product term (PT) line and an additional connection to a product term ground (PTG) line. The PT line forms an input to a buffer 312 included in a sense amplifier 310. The PTG line provides a connection to Vss in the sense amplifier 310. The sense amplifier 310 also includes a current source 314 connected to the input of the buffer 312. Array cells 301 and 302 are programmed to provide a connection from the PT to the PTG line, the connection being provided when the array cell receives an appropriate EN signal.

Although the circuit of FIG. 1 can be programmed to provide a path between its output and Vss, no separate enable (EN) is provided, making the cell of FIG. 1 inadequate for use as one of array cells 301 or 302 in a PLD.

Additionally, with the source of the NMOS transistor of a cell of FIG. 1 which is not selected for programming floating during programming of another array cell, current leakage can occur which can cause a disturb condition wherein electrons are injected onto the common floating gate in the unselected cell. As shown in Table I, for programming a particular cell, a WL voltage of Vcc is applied, but for cells not to be programmed receiving the same WC voltage, a WL voltage of Vpp+ is applied. The WL voltage of Vpp+ is applied so that the source of the PMOS transistors, such as 102, of unselected cells are floating, so that if the drains of the PMOS transistors of unselected cells are also floating, no leakage current will occur in unselected cells. However, a large number of cells in an array will require a long Vss line. The long Vss line may have a significant capacitive component, enabling charge storage. By connecting the source of NMOS transistors of the unselected cell to the Vss line, a current flow can occur to charge up the capacitance of the Vss line so that the drain of the NMOS transistor of the unselected cell is not floating. With the drain of an NMOS transistor not floating, the drain of a corresponding PMOS transistor to which it is connected will not be floating, but conducting a leakage current. Such current leakage during programming may disturb the program condition of unselected cells, which is not desirable.

U.S. patent application Ser. No. 08/447,991, entitled "A Completely Complementary MOS Memory Cell With Tunneling Through The NMOS And PMOS Transistors During Program And Erase" to Lin et al., incorporated herein by reference, discloses including an additional NMOS pass transistor between the source of the NMOS transistor 104 and Vss to limit leakage current from the NMOS transistor 104 to the Vss line during programming. However, use of the additional pass gates in the circuit of each CMOS memory cell undesirably increases the cell size. Further, the requirement that the source of either the PMOS transistor or NMOS transistor be floating during programming or erase is difficult to maintain without generating leakage current, irrespective of an additional pass gate.

SUMMARY OF THE INVENTION

The present invention includes modifications to the circuitry of FIG. 1 to enable the CMOS memory cell to be utilized in a PLD. The modifications include adding a pass gate transistor to connect the drains of the NMOS and PMOS transistors of a CMOS memory cell, while removing the PMOS pass gate 108. With such circuitry during read, an enable signal is provided to the gate of the additional pass gate to enable or disable connections through the NMOS transistor of the CMOS memory cell, making the CMOS cell useful as an array cell for a PLD.

The present invention further includes a method for programming and erasing CMOS memory cells to prevent current leakage. The method includes applying specific voltages to the sources of the NMOS and PMOS transistors during program and erase, rather than leaving either source floating. Such voltages are applied during program or erase without additional pass gates being connected to the sources of the PMOS or NMOS transistors of individual CMOS cells, or the additional pass gate provided between the drains of the PMOS and NMOS transistors, as described in the present invention.

BRIEF DESCRIPTION OF THE DRAWINGS

Further details of the present invention are explained with the help of the attached drawings in which.

DETAILED DESCRIPTION

Figure 4:
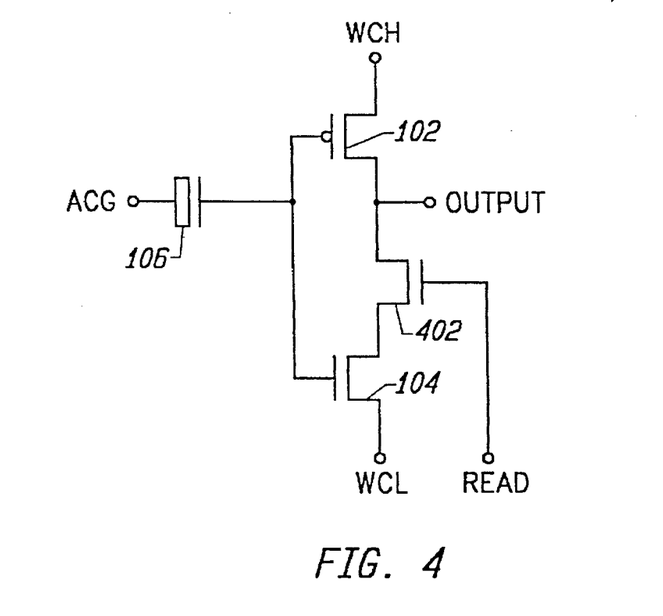
FIG. 4 shows a CMOS memory cell of the present invention.

FIG. 4 shows modifications to the CMOS memory cell of FIG. 1 to form a CMOS memory cell of the present invention. As shown, the circuit of FIG. 4 modifies the circuit of FIG. 1 by adding a pass gate transistor 402. The pass gate 402 has a source to drain path connecting the drain of PMOS transistor 102 to the drain of NMOS transistor 104. As shown in FIG. 4, the pass gate 402 is an NMOS device, although a PMOS device may be used.

In FIG. 4, the gate of the additional pass gate transistor 402 is connected to a read node (READ). Further in FIG. 4, the source of PMOS transistor 102, instead of being connected to receive the WC voltage as in FIG. 1, has a source connected to a WCH node. Also instead of the source of NMOS transistor 104 being connected to Vss, as in FIG. 1, NMOS transistor 104 has a source connected to a WCL node.

Figure 5:
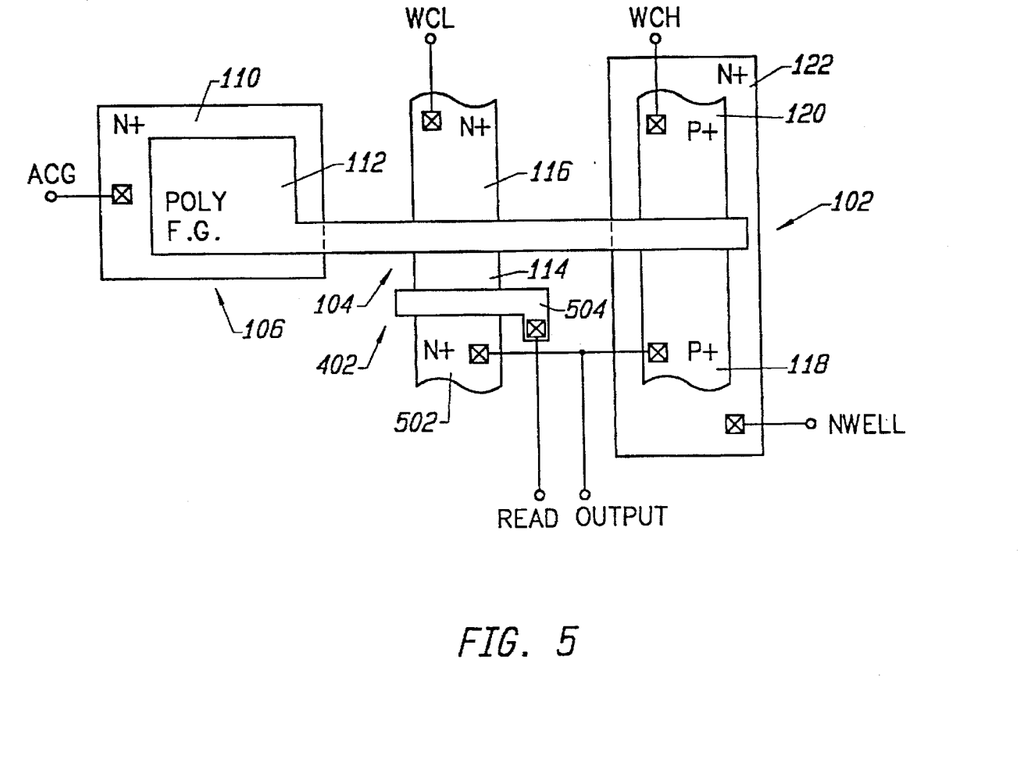
FIG. 5 shows a layout for the CMOS cell of FIG. 4.

FIG. 5 shows a layout for the cell of FIG. 4. As shown, the layout of FIG. 4 includes the regions of the layout of FIG. 2 with additional regions added for transistor 402 and with regions removed for pass gate 108. Transistor 402 is formed using the n+ implant region 114 of transistor 104 along with an additional n+ implant region 502. An additional polysilicon region 504 is utilized to bridge the two p type implant regions 114 and 502. The read node (READ) connection is provided to the polysilicon region 504. Further, the WCH node connection is provided to region 120, while the connection to region 116 is modified to be to a WCL node connection. An NWELL contact to n+ region 122 is further shown, the NWELL contact used for applying voltages to the n+ region 122 during a method of operation of the present invention.

Operation conditions for program, erase and not program of the present invention for the circuit of FIG. 4 in an array are described with reference to Table II below.

TABLE II

|  | ACG | WCL | WCH | Nwell | READ |
| --- | --- | --- | --- | --- | --- |
| Erase | 0 | Vpp | Vpp | Vpp | Vcc |
| Program | Vpp | 0 | Vcc | Vpp- | 0 |
| Not Prog. C12 | Vpp | Vpp- | Vcc | Vpp- | 0 |
| Not Prog. C21 | Vcc/2 | 0 | Vcc | Vpp- | 0 |
| Not Prog. C22 | Vcc/2 | Vpp- | Vcc | Vpp- | 0 |

Like the programming method described with respect to FIG. 1, for the circuit of FIG. 4, erase is selected as a condition which is done in an array in bulk, or for all cells, rather than on a cell-by-cell basis, as during program. Thus for the method described below for FIG. 4, during program, electrons transfer from the source of the NMOS transistor 104 to the common floating gate. Further, during erase, electrons transfer from the common floating gate to the source of the PMOS transistor 102.

To program the CMOS memory cell of FIG. 4, a voltage is applied between the array control gate (ACG) node of capacitor 106 and the WCL node at the source of the NMOS transistor 104 so that electrons transfer from the source of the NMOS transistor 104 to the common floating gate. Unlike with the method described with respect to FIG. 1, the source of PMOS transistor 102 is not floating during programming. Instead, the WCH voltage at the source of PMOS transistor 102 is maintained at a value to prevent tunneling of electrons from the common floating gate to the WCH node. As indicated in Table II, during program with ACG set to Vpp, WCL can be 0 V, while WCH is Vcc. A READ node voltage of 0 V is suggested during program to turn off transistor 402. An Nwell contract voltage of Vpp− is also applied for reasons described subsequently.

Figure 6:
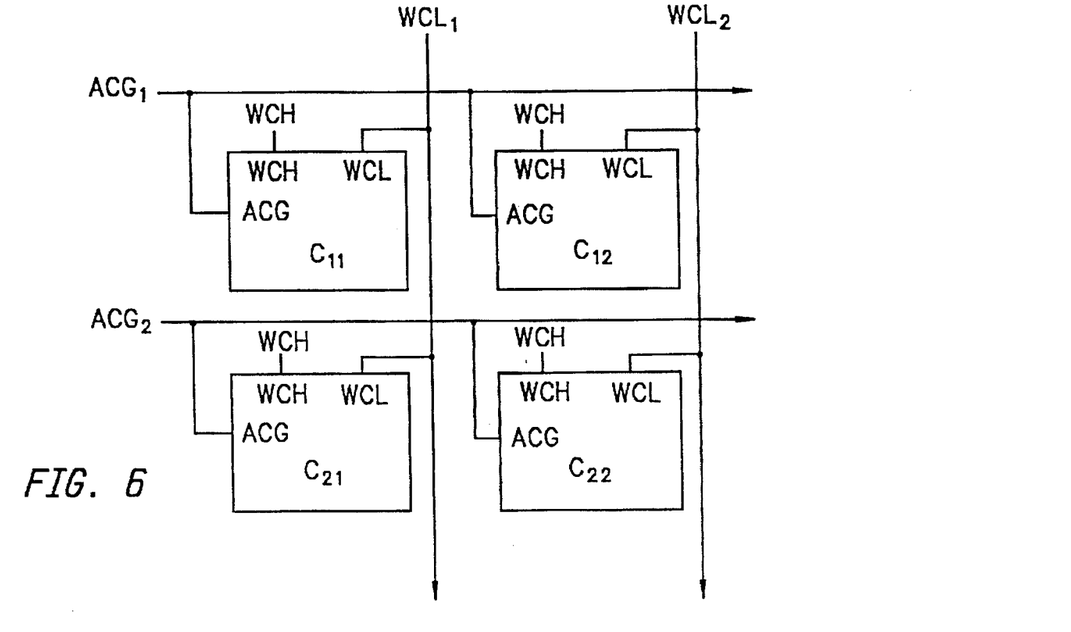
FIG. 6 shows connections of an array of the CMOS memory cells of FIG. 4 to illustrate not programming conditions.

Not programming conditions are described with respect to FIG. 6 which illustrates connections of an array of the CMOS memory cells, each configured as shown in FIG. 4. During programming, referring to FIG. 6, it is assumed that cell $C_{11}$ is selected for programming, while cells $C_{12}$, $C_{21}$ and $C_{22}$ are not selected. In other words, it is desired that the program condition of cells $C_{12}$, $C_{21}$ and $C_{22}$ not be disturbed.

As shown in Table II, during programming, a common ACG voltage is received by cells $C_{11}$ and $C_{12}$. With programming in cell $C_{11}$ caused by a voltage difference applied between the ACG and WCL nodes of cell $C_{11}$, the WCL voltage applied to cell $C_{12}$ is altered from cell $C_{11}$ to prevent such tunneling in cell $C_{12}$. As indicated in Table II, the WCL voltage applied to cell $C_{11}$ is 0 V during program, while for cell $C_{12}$, a voltage of Vpp− is applied. The voltage Vpp− is Vpp minus x volts, where x is desired to be the maximum reliable voltage value so that substantially no tunneling occurs from the source of the NMOS transistor of cell $C_{12}$ to its common floating gate.

With cell $C_{12}$ sharing a common WCL line with cell $C_{22}$, and cell $C_{12}$ receiving a WCL voltage of Vpp−, the ACG voltage of cell $C_{22}$ should be high enough to prevent tunneling in cell $C_{22}$. With Vcc/2, which is typically applied to ACG lines during read being an available voltage, and with Vcc/2 being high enough to prevent tunneling in cell $C_{22}$ with a WCL node voltage of Vpp−, an ACG voltage of Vcc/2 is suggested as being applied for cell $C_{22}$ as well as other cells not connected to receive the ACG voltage of cell $C_{11}$ during program.

The WCH voltage of Vcc is suggested in Table II for programming of cell $C_{11}$ as well as not programming in cells $C_{12}$, $C_{21}$ and $C_{22}$, although another value can be utilized. The WCH voltage is chosen to be high enough to substantially prevent tunneling through the PMOS transistor 102 in cell $C_{12}$ during program, but low enough to not cause tunneling in cells $C_{21}$ and $C_{22}$. The WCH voltage of Vcc in Table II is selected as an available voltage utilized during read, described below, Vcc meeting the criteria for programming and not programming as described.

The READ voltage of 0 V is suggested in Table II during programming of cell $C_{11}$ as well as not programming in cells $C_{12}$, $C_{21}$ and $C_{22}$, although another value may be utilized. The read voltage of 0 V turns off transistor 402. However, the voltage state of the READ node may be altered to turn on transistor 402 because the state of transistor 402 is not critical to program or not programming conditions.

To prevent forward bias of a PMOS transistor in cell $C_{11}$, as well as cells $C_{12}$, $C_{21}$ and $C_{22}$, forward bias resulting in electrons transferring from the floating gate to the source of the PMOS transistor in the cell, a depletion region should exist between the source and gate of the PMOS transistor in the cell. To provide a depletion region, the n well voltage of a PMOS transistor should be maintained higher than its source voltage.

To provide a depletion region, because the source of a PMOS transistors is at Vcc, any voltage at Vcc or above might be applied to its n well. To assure that the depletion region remains above Vcc, however, a slightly higher voltage of Vpp− is applied to the Nwell contact as indicated in Table II during programming.

Figure 7:
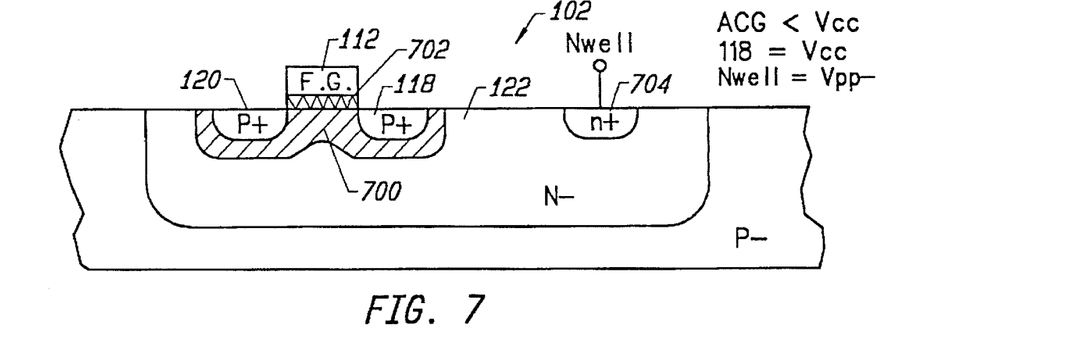
FIG. 7 shows a cutaway view of the PMOS transistor of FIG. 5 illustrating a depletion region formed using a low floating gate voltage.

FIG. 7 shows a cutaway view of the PMOS transistor 102 of FIG. 5 illustrating a depletion region 700 formed using a low floating gate voltage. As shown, the depletion region 700 is formed in n well region 122 around the source region 118 and drain region 120. A floating gate 112 is separated from the depletion region 700 by a gate oxide region 702. The depletion region 700 is illustrated assuming that the floating gate voltage is below Vcc, the source 118 is at Vcc, and the n well 122 is maintained at Vpp− by the Nwell contact 704. With such voltages applied, the voltage drop across the gate oxide 702 will be Vcc minus the voltage on the floating gate 112.

Figure 8:
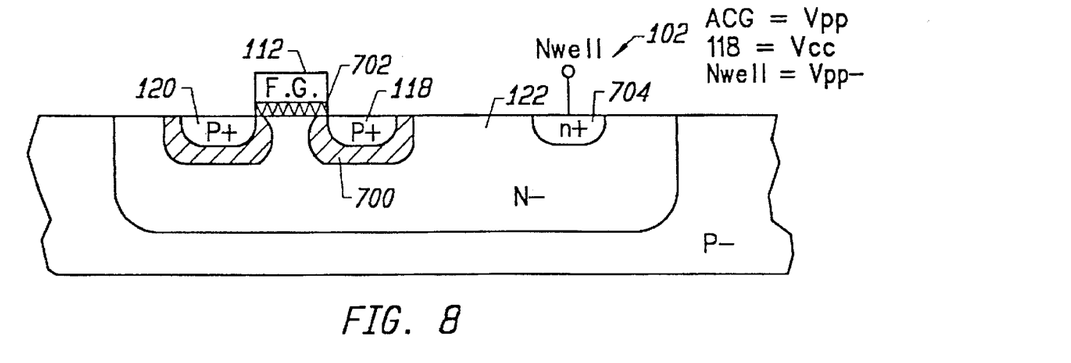
FIG. 8 shows changes to the depletion region of FIG. 7 when the ACG voltage is raised to Vpp.

FIG. 8 shows changes to the depletion region 700 of FIG. 7 when the ACG voltage is raised to Vpp. With the n region 122 at Vpp− when ACG goes to Vpp, a voltage above Vcc will appear on the floating gate 120. With a high floating gate voltage, the depletion region 700 between the gate oxide 702 and the source 118 will be reduced. The depletion region limits the voltage drop across the floating gate 112 to prevent electrons from tunneling from the source 118. Even with a high ACG voltage, with a voltage on the n well 122 being greater than the source voltage 118, as indicated for the cells in Table II, a depletion region will remain between the gate oxide 702 and source 700 to prevent electrons from tunnelling.

A similar depletion region is created to prevent tunneling of electrons from the floating gate to the source of the NMOS transistor 104 as controlled by the substrate voltage. Typically, the substrate voltage is maintained at ground. With the substrate voltage grounded, a depletion region is formed to prevent tunnelling when necessary with the voltages shown in Table II.

To erase the CMOS memory cell of FIG. 4, a voltage is applied between the array control gate (ACG) node of capacitor 106 and the WCH node at the source of the PMOS transistor 102 so that electrons transfer from the common floating gate to the source of PMOS transistor 102. Unlike with the method described with respect to FIG. 1, the source of NMOS transistor 104 is not floating during erase. Instead, the WCL voltage at the source of NMOS transistor 104 is maintained at a value to prevent tunneling of electrons from the common floating gate to the WCL node. As indicated in Table II, during erase, with WCH set to Vpp and ACG at 0 V, WCL can be Vpp. Further, an Nwell contact voltage equal to the WCH voltage of Vpp is maintained at the source of the PMOS transistor 102 to provide a depletion region between the source and floating gate of the PMOS transistor 102, as described above, to prevent tunnelling of electrons from the floating gate to the WCH node. The voltage state of the READ node is not critical to erase, although Vcc is suggested in Table II. Because erase is done in bulk, similar voltages are applied to all CMOS cells in an array.

To read using the CMOS cell of FIG. 4, similar suggested voltages are applied to the ACG input and sources of the PMOS and NMOS transistors 102 and 104, as when reading with the CMOS cell of FIG. 1. Further, an Nwell contact voltage is maintained equal to the WCH voltage to prevent disturb of the programming condition of the floating gate. Table III below shows voltages applied to a cell during read.

TABLE III

|  | ACG | WCL | WCH | Nwell | READ |
|---|---|---|---|---|---|
| Read | Vcc/2 | 0 | Vcc | Vcc | Vcc or 0 |

For the erase, program, not program and read voltages listed in Tables II and III, a suggested voltage Vpp is 12 V, although other voltages may be utilized. Further, a suggested value for Vcc is 5 V, or 3 V for low power devices, although other voltages may be utilized.

Note that table III indicates that the READ node voltage may be either Vcc or 0 volts which enables optionally turning on or off transistor 402. Because the CMOS memory cell of FIG. 4 includes an NMOS pass gate 402 which provides a means to enable or disable NMOS transistor 104, apart from programming its floating gate, the CMOS memory cell of FIG. 4 may be utilized in a PLD.

To provide the CMOS cell of FIG. 4 as one of array cells 301 and 302 of FIG. 3, the drain of NMOS pass gate 402 is connected to the PT line, the WCL node is connected to the PTG line, and the READ node is connected to receive an EN signal. The READ signal of Vcc may then be applied to enable the CMOS cell, since NMOS pass gate 402 will be on creating a path from PT to PTG if NMOS transistor 104 is appropriately programmed. Further, a READ signal of 0 V may then be applied to disable the CMOS cells since NMOS pass gate 402 will be off, disabling any path from PT to PTG.

With use of a path only between the OUTPUT node and the WCL node when a CMOS cell is configured for use in a PLD, no path through the PMOS transistor 102 is necessary. Further, program, erase and not-program conditions do not require specific conditions of the READ node which, as indicated above, can be set to enable or disable cell 402. Thus, the connection between the OUTPUT node and the source of transistor 102 can be eliminated, as illustrated in FIG. 9, when the cell of FIG. 4 is utilized in a PLD.

Figure 9:
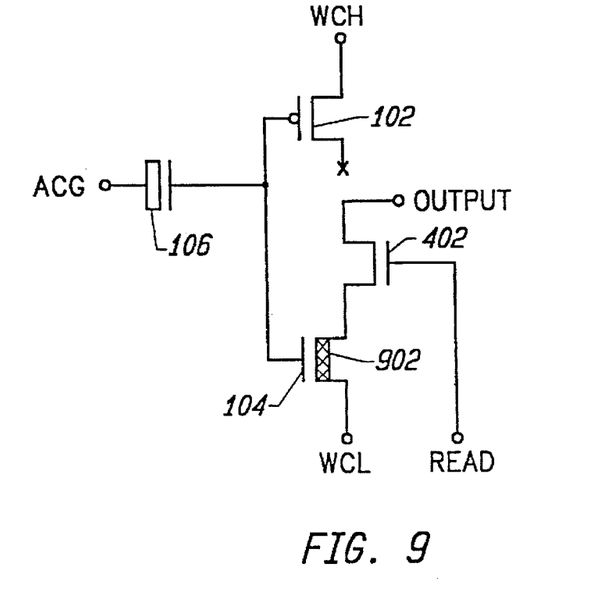
FIG. 9 illustrates elimination of a connection between the OUTPUT node and the WCL node of the circuit of FIG. 4, as well as utilization of a depletion mode NMOS transistor.

FIG. 9 further illustrates utilization of a depletion mode NMOS transistor 104 when the cell of FIG. 4 is utilized in a PLD. The depletion mode transistor is desirable during read conditions with the ACG and WCH voltages shown in Table III changed to 0 V. ACG and WCH settings of zero volts are used to maximize storage time for charge on floating gates of the CMOS cells. The depletion mode NMOS transistor is created by applying additional ion implantation 902 in the channel of NMOS transistor 104 to lower its threshold below zero volts. With the threshold of NMOS transistor 104 below zero volts, less voltage drop occurs from the source to drain of NMOS transistor 104. With reduced voltage drop across the NMOS transistor 104, current to the sense amplifiers is increased from conventional CMOS cells during read making switching times faster. With ACG and WCH voltages applied as shown in Table III, a depletion mode transistor would not be used.

In addition to being utilized in a PLD, as described above, the CMOS cell of the present invention may also be utilized in other system configurations. For instance, the memory cell of FIG. 4 may be utilized to control a switch in a switch matrix of a PLD, or as an array cell in a field programmable gate array (FPGA).

Figure 10:
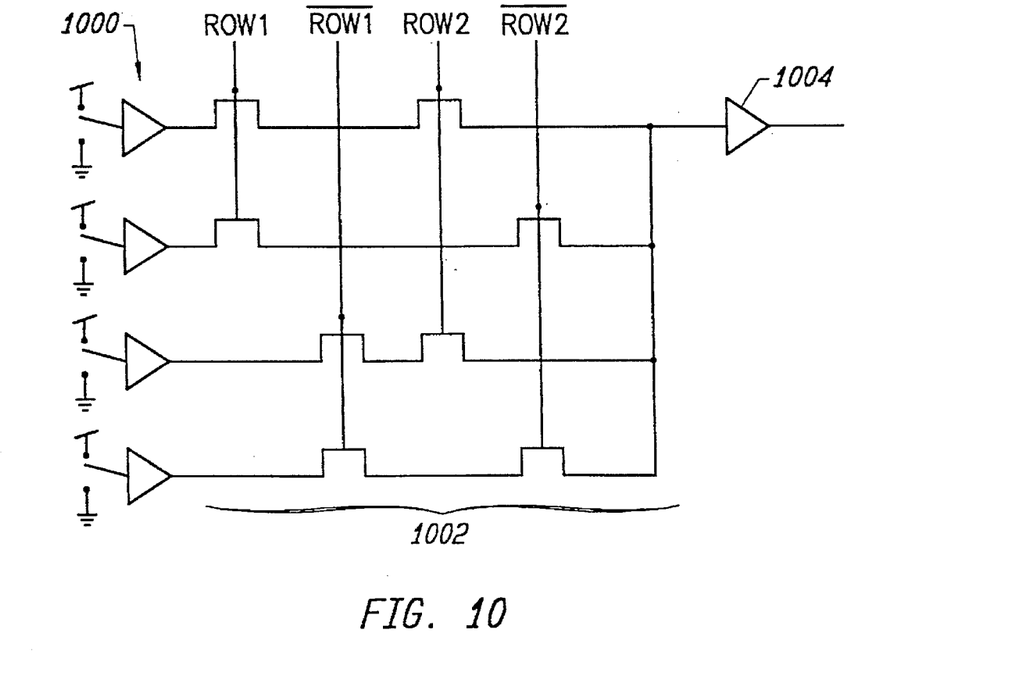
FIG. 10 illustrates the configuration of circuitry a switch matrix of a PLD, or an FPGA device.

FIG. 10 illustrates the configuration of circuitry in a switch matrix of a PLD, or in an FPGA wherein a programmable CMOS cell may be utilized as a switch. FIG. 10 includes array cells 1000 individually connecting Vcc or Vss through pass gates 1002 to a buffer 1004 as controlled by signals ROW1, $\overline{ROW1}$, ROW2 and $\overline{ROW2}$. By appropriately programming the floating gate of the CMOS cell of FIG. 4; the CMOS cell provides a connection either to Vcc (through WCH), or to Vss (through WCL), as required for array cells 1000.

Use of the CMOS memory cell of FIG. 4 as a switch, as illustrated in FIG. 10, can be advantageous because, being constructed from CMOS technology, it enables zero power operation. Zero power operation indicates that the CMOS cell does not continually draw power when the CMOS cell is not changing states.

Use of the method of programming and erasing of the present invention, coupled with use of a CMOS cell as a switch, as illustrated in FIG. 10, can also be advantageous because the NMOS pass transistor 402 of FIG. 4 is not required. In explanation, during read conditions with the CMOS cell of FIG. 4 used as a switch, Vcc is applied to the READ node to enable transistor 402. Further, as discussed previously, during program, read and not program conditions indicated in Table II, the voltage state of the READ node is not critical, indicating Vcc can be applied to the READ node to create a connection between the sources of the PMOS and NMOS transistors 102 and 104. Thus, when utilized as a switch, as illustrated in FIG. 10, a CMOS memory cell can be provided with components limited to those shown in FIG. 11.

Figure 11:
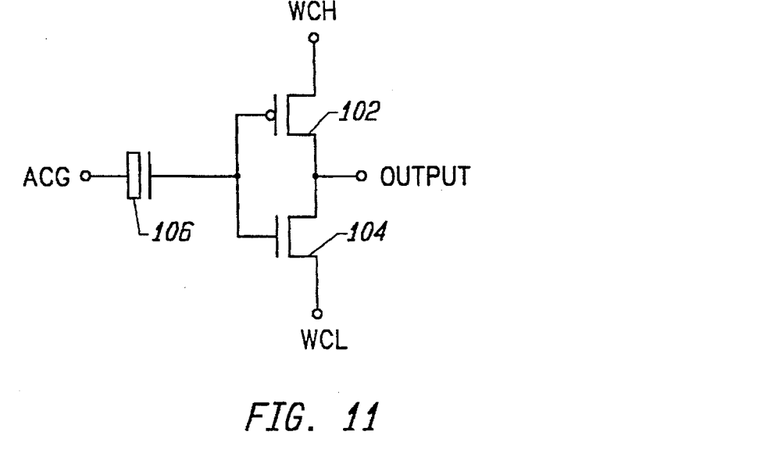
FIG. 11 illustrates the CMOS memory cell of FIG. 4 with the NMOS pass gate replaced with a direct connection.
Figure 12:
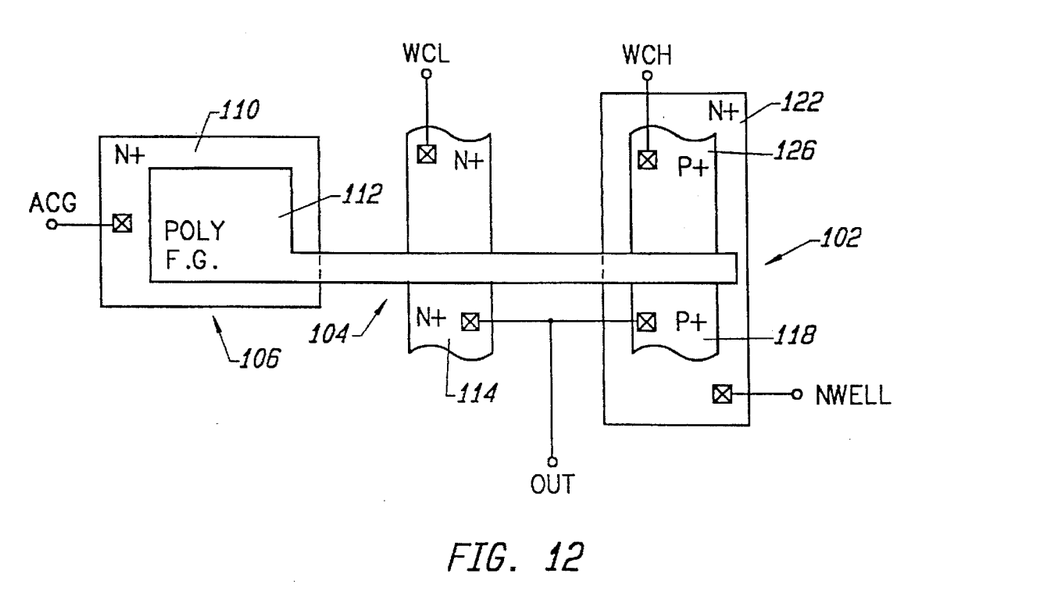
FIG. 12 shows a layout for the CMOS cell of FIG. 11.

As shown, the CMOS cell of FIG. 11 includes only capacitor 106, PMOS transistor 102 and NMOS pass transistor 104. FIG. 12 shows a layout for the CMOS memory cell of FIG. 11. As shown in FIG. 12, due to elimination of transistors, the layout space required for the cell of FIG. 11 is less than the layout of the CMOS cells shown in FIGS. 2 and 5. As shown, the layout of FIG. 12 eliminates the PMOS pass transistor 108 from the layout shown in FIG. 2, or the NMOS pass transistor 402 from the layout shown in FIG. 5.

As indicated in the Lin reference, discussed previously, the layout for cells of the present invention might also be modified to include a double polysilicon layer to enable components of capacitor 106 to be stacked above the gate oxide layer and polysilicon floating gate 112 of transistors 102 and 104 to further reduce required space for the cell layouts of the present invention, as illustrated in FIGS. 5 and 12.

To assure charge storage on the floating gate of the CMOS memory cell of FIG. 4 is practical to turn on one of transistors 102 and 104 while turning the other off, during read Vcc may be applied through a voltage reference to the WCH node. Without such a reference, with Vcc applied directly from an external source to a chip Vcc pin, unregulated variations in Vcc can occur. Such variations in Vcc require that an unacceptably high voltage be applied to the common floating gate to assure PMOS transistor 102 can be turned off. U.S. patent application Ser. No. 08/426,741, entitled "Reference for CMOS Memory Cell Having PMOS and NMOS Transistors With a Common Floating Gate" filed Apr. 21, 1994, (hereinafter, the CMOS reference patent application), incorporated herein by reference, discloses such a reference for a CMOS memory cell.

Further, as in the Lin reference, discussed previously, additional ion implantation in PMOS transistor 102 and NMOS transistor 104 may be utilized to maximize data retention in CMOS memory cells, as well as to assure zero power operation in subsequent CMOS circuitry. The additional ion implantation is applied in the channel between the source and drain of the PMOS and NMOS transistors 102 and 104 to alter the sum of the magnitude of the threshold of the PMOS and NMOS transistors to be substantially equal to, or greater than Vcc. Zero power operation is then enhanced because when Vcc is applied to CMOS transistors following the CMOS memory cells, no current leakage will occur in the subsequent CMOS transistors. Data retention may be enhanced utilizing additional ion implantation to control the magnitude of the thresholds of the PMOS and NMOS transistors so that only a minimal amount of charge needs to be added or removed from the floating gate of a CMOS cell to turn the CMOS cell on or off.

Although the invention has been described above with particularity, this was merely to teach one of ordinary skill in the art how to make and use the invention. Many modifications will fall within the scope of the invention, as that scope is defined by the claims which follow.

What is claimed is:

1. A CMOS memory cell comprising:
    a common floating gate;
    a capacitor having a first terminal forming a control gate and a second terminal coupled to the common floating gate;
    an output node;
    an NMOS transistor having a drain, a channel formed between its source and drain, and a tunneling oxide region and the common floating gate overlying its channel;
    a PMOS transistor having a channel formed between its source and drain, and a tunneling oxide region and the common floating gate overlying its channel; and
    a pass gate having a source to drain path coupling the drain of the NMOS transistor to the output node of the CMOS memory cell.

2. The CMOS memory cell of claim 1, wherein the pass gate is an NMOS transistor.

3. The CMOS memory cell of claim 1, wherein the output node is further connected to the drain of the PMOS transistor.

4. The CMOS memory cell of claim 1, wherein the NMOS transistor is a depletion mode transistor having a threshold below zero volts.

5. A CMOS memory cell comprising:
    a common floating gate;
    a capacitor having a first terminal forming a control gate and a second terminal coupled to the common floating gate;
    an output node;
    an NMOS transistor having a drain, a channel formed between its source and drain, and a tunneling oxide region and the common floating gate overlying its channel;
    a PMOS transistor having a drain connected to the drain of the NMOS transistor, a channel formed between its source and drain, and a tunneling oxide region and the common floating gate overlying its channel.

6. A method of programming a first CMOS memory cell including a common floating gate; a capacitor having a first terminal forming an ACG node and a second terminal coupled to the common floating gate; an NMOS transistor having a source connected to a WCL node, a channel formed between its source and drain, and a tunneling oxide region and the common floating gate overlying its channel; and a PMOS transistor having a source connected to a WCH node, a channel formed between its source and drain, and a tunneling oxide region and the common floating gate overlying its channel, wherein programming results in electrons being added to the common floating gate, programming comprising the steps of:
    applying a first voltage difference between the ACG node and the WCL node so that electrons transfer from the source of the NMOS transistor to the common floating gate; and
    applying a second voltage difference, concurrent with application of the first voltage difference, between the ACG node and the WCH node so that substantially no tunneling of electrons occurs from the source of the PMOS transistor to the common floating gate.

7. The method of claim 6 further comprising a step for preventing current leakage in second CMOS memory cells having components similar to the first CMOS memory cell, with capacitors of the second CMOS memory cells having ACG nodes connected to the ACG node of the first CMOS memory cell, the further step comprising:
    applying a third voltage difference between the ACG node and the WCL node of the second memory cells, the third voltage difference being less than the first voltage difference so that substantially no electrons transfer from the source of the NMOS transistor to the common floating gate of the second CMOS memory cells.

8. The method of claim 7, wherein the third voltage difference is a minimum reliable voltage difference which will substantially prevent electrons from transferring from the source of the NMOS transistor to the common floating gate of the second CMOS memory cells.

9. The method of claim 7 further comprising a step for preventing current leakage in third CMOS memory cells having components similar to the first CMOS memory cell, with WCL lines of the third CMOS memory cells being connected to the WCL lines of the second CMOS memory cell, the further step comprising:
    applying a fourth voltage difference between the ACG line and the WCL node of the second memory cells, the fourth voltage difference having a value set to prevent tunneling in the third CMOS memory cells.

10. The method of claim 6, wherein the source and drain of the PMOS transistor is provided in an n well of a p– type substrate, the n well being connected to an Nwell node, the method further comprising the step of:
    applying a voltage potential to the Nwell node greater than a voltage potential provided to the WCH node during application of the second voltage difference.

11. The method of claim 9 further comprising steps for erasing the first, second and third CMOS memory cells, wherein erasing results in electrons being added to the common floating gate, the further steps comprising:
    applying a fifth voltage difference between the ACG node and the WCH node of the first, second and third CMOS memory cells so that electrons transfer from the common floating gate to the source of the PMOS transistor in each CMOS memory cell; and
    applying substantially no voltage difference between the WCL and WCH nodes of the first, second and third CMOS memory cells, concurrent with application of the fifth voltage difference, so that no substantial electron transfer occurs from the common floating gate to the source of the NMOS transistor in each CMOS memory cell.

12. The method of erasing a CMOS memory cell including a common floating gate; a capacitor having a first terminal forming an ACG node and a second terminal coupled to the common floating gate; an NMOS transistor having a source connected to a WCL node, a channel formed between its source and drain, and a tunneling oxide region and the common floating gate overlying its channel; and a PMOS transistor having a source connected to a WCH node, a channel formed between its source and drain, and a tunneling oxide region and the common floating gate overlying its channel, wherein erasing results in electrons being added to the common floating gate, erasing comprising the steps of:

applying a voltage difference between the ACG node and the WCH node of the CMOS memory cell so that electrons transfer from the common floating gate to the source of the PMOS transistor; and applying substantially no voltage difference between the WCL and WCH nodes concurrent with application of the fifth voltage difference, so that no substantial electron transfer occurs from the common floating gate to the source of the NMOS transistor.

13. A programmable logic device (PLD) receiving an input, the PLD comprising:

a sense amplifier having a product term (PT) input and a product term ground (PTG) input;

a plurality of memory cells, each comprising:

a common floating gate;

a capacitor having a first terminal forming a control gate and a second terminal coupled to the common floating gate;

an output node;

an NMOS transistor having a drain, a channel formed between its source and drain, and a tunneling oxide region and the common floating gate overlying its channel;

a PMOS transistor having a channel formed between its source and drain, and a tunneling oxide region and the common floating gate overlying its channel; and a pass gate having a source to drain path coupling the drain of the NMOS transistor to the output node of the CMOS memory cell.

\* \* \* \* \*